(12) United States Patent
Bae et al.

(10) Patent No.: US 9,466,760 B2
(45) Date of Patent: Oct. 11, 2016

(54) HORIZONTAL POWER LED DEVICE AND METHOD FOR MANUFACTURING SAME

(71) Applicants: Jeong Woon Bae, Gyeonggi-do (KR); Jong Young Shim, Seoul (KR); CLPHOTONICS CO., LTD., Seoul (KR)

(72) Inventors: Jeong Woon Bae, Gyeonggi-do (KR); Seong Wook Ryu, Gyeonggi-do (KR); Jong Young Shim, Seoul (KR)

(73) Assignees: Jeong Woon Bae, Gyeonggi-Do (KR); Jong Young Shim, Seoul (KE); CLPHOTONICS CO., LTD., Seoul (KR)

( * ) Notice: Subject to any disclaimer, the term of this patent is extended or adjusted under 35 U.S.C. 154(b) by 0 days.

(21) Appl. No.: 15/136,881

(22) Filed: Apr. 23, 2016

(65) Prior Publication Data

US 2016/0247963 A1  Aug. 25, 2016

Related U.S. Application Data

(62) Division of application No. 14/386,802, filed as application No. PCT/KR2012/002089 on Mar. 22, 2012, now Pat. No. 9,343,623.

(51) Int. Cl.
| | | |
|---|---|---|
| *H01L 21/00* | (2006.01) | |
| *H01L 33/00* | (2010.01) | |
| *H01L 33/14* | (2010.01) | |
| *H01L 33/24* | (2010.01) | |
| *H01L 33/42* | (2010.01) | |

(52) U.S. Cl.
CPC ....... *H01L 33/0075* (2013.01); *H01L 33/0008* (2013.01); *H01L 33/0095* (2013.01); *H01L 33/14* (2013.01); *H01L 33/24* (2013.01); *H01L 33/42* (2013.01); *H01L 2933/0016* (2013.01); *H01L 2933/0033* (2013.01); *H01L 2933/0066* (2013.01)

(58) Field of Classification Search
CPC ............... H01L 33/0073; H01L 33/32; H01L 21/0254; H01L 21/02458; H01L 21/0262
USPC ............................................. 438/25, 46, 458
See application file for complete search history.

(56) References Cited

U.S. PATENT DOCUMENTS 8,017,967 B2 * 9/2011 Suehiro ............... H01L 23/3121
257/734

* cited by examiner

*Primary Examiner* — Quoc Hoang
(74) *Attorney, Agent, or Firm* — The PL Law Group, PLLC

(57) ABSTRACT

A method of manufacturing a horizontal power LED device includes constructing a light-emitting structure on a substrate, etching the light-emitting structure, fabricating an electrode, forming an insulating film, forming a metal substrate, removing the substrate from the light-emitting structure, and forming an n-pad. A high-power and high-efficiency horizontal LED device is manufactured by the method of manufacturing the same.

12 Claims, 7 Drawing Sheets

PRIOR ART

HORIZONTAL POWER LED DEVICE AND METHOD FOR MANUFACTURING SAME

CROSS REFERENCE TO RELATED APPLICATIONS AND CLAIM OF PRIORITY

This application is a divisional application of application Ser. No. 14/386,802, filed on Sep. 21, 2014, which is a National Phase application under 35 U.S.C. §371 of International Application No. PCT/KR2012/002089, filed Mar. 22, 2012, entire contents of which are incorporated herein by reference.

BACKGROUND

1. Technical Field

The present invention relates to a horizontal LED device and a method of manufacturing the same. More particularly, the present invention relates to a high-power and high-efficiency horizontal LED device, which is manufactured by using the advantages of conventional horizontal and vertical LEDs, and a method of manufacturing the same.

2. Background Art

Generally, as shown in FIG. 1a, a horizontal LED device is configured in the basic form of a light-emitting structure including one light-emitting active layer (MQWS) and two cladding layers (p-GaN, n-GaN) covering both sides of the active layer. The cladding layers making contact with electrodes are n-doped and p-doped, respectively. The cladding layer making contact with a substrate is n-doped, and the other cladding layer is p-doped. When voltage is applied to each of the doped cladding layers through an electrode in accordance with the polarity thereof, the n-doped cladding layer supplies electrons, and the p-doped cladding layer supplies holes. At this time, electric current flows, and simultaneously these electrons and holes are combined in the active layer disposed between the cladding layers, thus emitting light. The substrate reflects or transmits the light emitted from the active layer according to the wavelength thereof. As the substrate, a sapphire substrate having low thermal conductivity and insulation properties is generally used. Such a horizontal LED device has a low current spreading effect and a high current crowding effect, emits light non-uniformly, and has a small emitting area per chip. Therefore, this horizontal LED device is disadvantageous for use in a large area.

As shown in FIG. 1b, a flip-chip LED device is configured such that the horizontal LED device is overturned and then fixed on a silicon sub-mount by a stud bump. Therefore, this flip-chip LED device is actually identical to the horizontal LED device in terms of a basic structure for light emission. Since the flip-chip LED device emits light through a substrate, light extraction is improved, thus exhibiting excellent heat radiation characteristics and high power characteristics. However, this flip-chip LED device additionally requires a sub-mount and a soldering process.

As shown in FIG. 1c, a vertical LED device (thin GaN) maintains an original form in which a part of a laminate is not removed by etching in terms of a basic structure for light emission. Generally, the basic structure of the vertical LED device is accomplished by the steps of: sequentially a bonding reflector and a receptor onto a cladding layer; forming an electrode; separating a substrate; and forming an electrode on a cladding layer of the separated substrate. The vertical LED device is configured such that the light emitted from the active layer thereof is vertically reflected from a reflective plate and then discharged upwardly. Thus, this vertical LED device has excellent heat radiation characteristics and high power characteristics. Such a vertical LED device has a high current spreading effect and a low current crowding effect, emits light uniformly, and has a large emitting area, and so this vertical LED device is advantageous for use in a large area. However, this vertical LED device has a problem of complicated processes and a low yield.

Therefore, it is required to develop a novel LED device for overcoming the disadvantages of a conventional LED device and a manufacturing method thereof.

SUMMARY

The present inventors made efforts to solve the conventional problems, thus completing the present invention by applying the advantages of a vertical LED device to a horizontal LED device.

Accordingly, an object of the present invention is to provide a horizontal power LED device, which can exhibit high power and high efficiency by minimizing the reduction of a light emission area, and a method of manufacturing the same.

Another object of the present invention is to provide a horizontal power LED device, which can exhibit high power and high efficiency because the thickness of an n-clad layer can be maintained so as to be advantageous to current spreading, and a method of manufacturing the same.

Still another object of the present invention is to provide a horizontal power LED device, which can exhibit high power and high efficiency because an N-electrode is formed on a Ga-face to provide low VT, and a method of manufacturing the same.

Still another object of the present invention is to provide a horizontal power LED device, which can exhibit high power and high efficiency because the entire spreading is conducted by an embedded grid electrode, while current spreading is horizontally conducted, thus not causing a current crowding phenomenon, and a method of manufacturing the same.

Still another aspect of the present invention is to provide a horizontal power LED device, which has conventional vertical chip characteristics due to the formation of a metal substrate, which has flip chip characteristics because a sub-mount or a soldering process is not required, and which can exhibit high power and high efficiency because the improvement of efficiency of light extraction can be expected due to the formation of unevenness, and a method of manufacturing the same.

The objects of the present invention are not limited to the above-mentioned objects, and other unmentioned objects thereof will be clearly understood by those skilled in the art from the following descriptions.

In order to accomplish the above objects, an aspect of the present invention provides a horizontal power LED device, a light-emitting structure in which an N-type gallium nitride semiconductor layer (n-GaN layer), an active layer and a P-type gallium nitride semiconductor layer (p-GaN layer) are sequentially laminated; a P-type electrode formed on a surface of the p-GaN layer of the light-emitting structure, the surface being not adjacent to the active layer; an N-type electrode formed on a back side of the n-GaN layer of the light-emitting structure, the back side being adjacent to the active layer; an insulation film covering the entire surface of the light-emitting structure, except for a surface of the n-GaN layer, opposite to the n-GaN layer's surface adjacent to the active layer, and for such a surface of the p-GaN layer as to expose the p-type electrode; a metal substrate formed to cover the insulation film and the P-type electrode; and an n-pad formed to communicate with the N-type electrode via a through-hole formed in the n-GaN layer of the light-emitting structure, extending from the surface of the n-GaN layer to the N-type electrode.

Preferably, the horizontal power LED device may further comprise convex-concave portions formed on an entire surface of the n-GaN layer of the light-emitting structure, except for the through-hole where the n-pad is formed.

Preferably, the horizontal power LED device may further comprise a seed layer formed between the insulation film and the metal substrate and between the P-type electrode and the metal substrate.

Preferably, the seed layer may be used as a reflective layer when the P-type electrode is a transparent electrode.

Preferably, the metal substrate may include one or more of copper (Cu), nickel (Ni), gold (Au) and molybdenum (Mo).

Another aspect of the present invention provides a method of manufacturing a horizontal power LED device, comprising the steps of: constructing a light-emitting structure on a substrate, the light-emitting structure being a laminated structure in which an N-type gallium nitride semiconductor layer (n-GaN layer), an active layer and a P-type gallium nitride semiconductor layer (p-GaN layer) are sequentially disposed; etching the light-emitting structure to expose the n-GaN layer and the substrate in such a way to form a separation part having a size corresponding to a predetermined chip size; fabricating an electrode by forming a P-type electrode on the p-GaN layer and by forming an N-type electrode on an exposed region of n-GaN layer; forming an insulating film by depositing an insulation material to cover the p-GaN layer and the exposed n-GaN layer, followed by etching the deposited insulation material to expose a P-type electrode formed on the p-GaN layer; forming a metal substrate to cover the insulation film and the P-type electrode; removing the substrate from the light-emitting structure; and forming an n-pad by forming a through-hole in the n-GaN layer at a margin region, extending from the upper surface of the n-GaN layer to the N-type electrode, and by depositing the n-pad in such a manner that the n-pad communicates with the N-type electrode via the through-hole.

Preferably, the method may further include the step of forming convex-concave portions on the surface of the n-GaN layer of the light-emitting structure, before or after the step of forming the n-pad.

Preferably, the method may further include the step of: forming a seed layer to cover the insulation film and the P-type electrode, before the step of forming the metal substrate.

Preferably, the light-emitting structure etching step is carried out in such a way that the p-GaN layer and the active layer are etched to expose the n-GaN layer, with the etched p-GaN layer positioned at a center of the resulting structure, after which the exposed the n-GaN layer is etched such that the substrate is exposed to form a separation part at the end of the n-GaN layer.

Preferably, the light-emitting structure etching step is conducted by etching the light-emitting structure to expose the substrate, and then further etching the light-emitting structure to expose only a part of the n-GaN layer, thereby forming a separation part.

Preferably, the method may further include the step of: forming a chip by cutting the separation part.

Preferably, the metal substrate includes one or more of copper (Cu), nickel (Ni), gold (Au) and molybdenum (Mo).

The present invention has the following advantageous effects.

First, according to the horizontal power LED device and manufacturing method thereof, high power and high efficiency can be exhibited because the reduction of a light emission area caused by an electrode can be maximized.

Further, according to the horizontal power LED device and manufacturing method thereof, high power and high efficiency can be exhibited because the thickness of an n-clad layer can be maintained.

Further, according to the horizontal power LED device and manufacturing method thereof, high power and high efficiency can be exhibited because an N-electrode is formed on a Ga-face to provide low VT.

Further, according to the horizontal power LED device and manufacturing method thereof, high power and high efficiency can be exhibited because the entire spreading is conducted by an embedded grid electrode, while current spreading is horizontally conducted, thus not causing a current crowding phenomenon.

Further, according to the horizontal power LED device and manufacturing method thereof, this horizontal power LED device has conventional vertical chip characteristics due to the formation of a metal substrate, has flip chip characteristics because a sub-mount or a soldering process is not required, and can exhibit high power and high efficiency because the improvement of efficiency of light extraction can be expected due to the formation of unevenness.

BRIEF DESCRIPTION OF DRAWINGS

FIGS. 4a to 4h are sectional views and plan views showing a process of manufacturing the horizontal power LED device of FIG. 2.

DETAILED DESCRIPTION

Figure 1A:
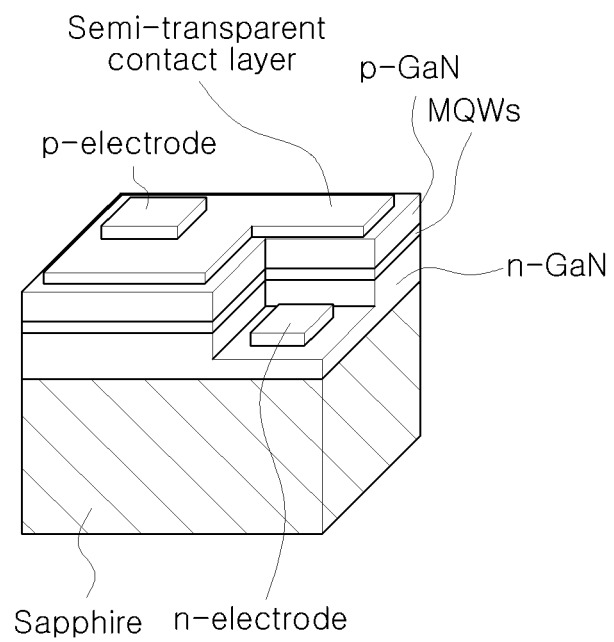
FIGS. 1a to 1c are schematic perspective views showing a horizontal LED device, a flip-chip LED device and a vertical LED device, respectively.
Figure 1B:
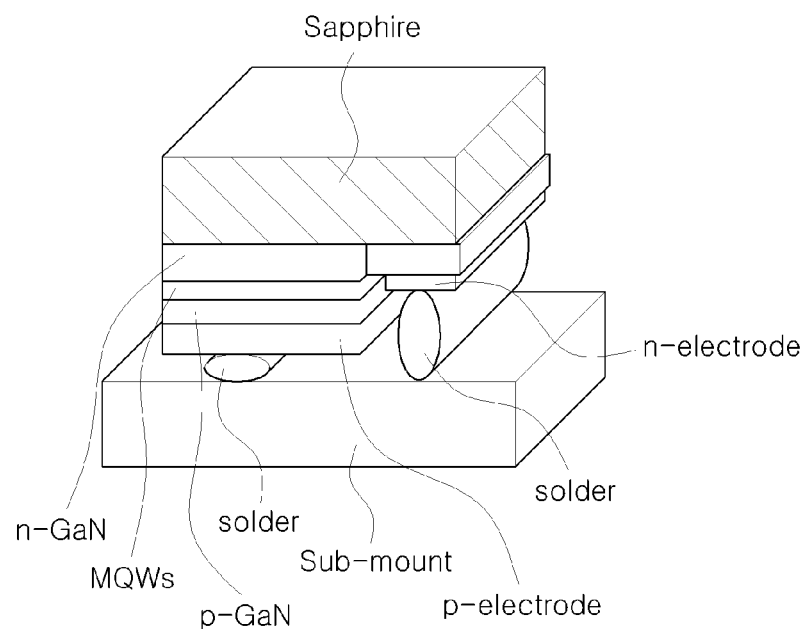
Figure 1C:
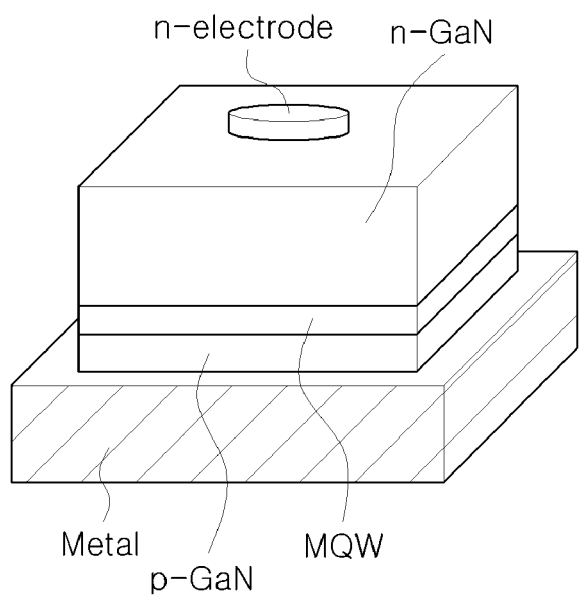

It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, preferred embodiments of the present invention will be described in detail with reference to the attached drawings.

Throughout the accompanying drawings, the same reference numerals are used to designate the same or similar components, and redundant descriptions thereof are omitted.

The horizontal power LED device and manufacturing method thereof according to the present invention is technically characterized in that the reduction of a light-emitting area attributable to electrodes can be minimized, the thickness of an n-clad layer can be maintained, an N-electrode can be formed on a conventional Ga-face, and a metal substrate is provided, thus exhibiting high power and high efficiency.

Therefore, the horizontal power LED device of the present invention includes: a light-emitting structure in which an N-type gallium nitride semiconductor layer (n-GaN layer), an active layer and a P-type gallium nitride semiconductor layer (p-GaN layer) are sequentially laminated; a P-type electrode formed on a surface of the p-GaN layer of the light-emitting structure, the surface being not adjacent to the active layer; an N-type electrode formed on a back side of the n-GaN layer of the light-emitting structure, the back side being adjacent to the active layer; an insulation film covering the entire surface of the light-emitting structure, except for a surface of the n-GaN layer, opposite to the n-GaN layer's surface adjacent to the active layer, and for such a surface of the p-GaN layer as to expose the p-type electrode; a metal substrate formed to cover the insulation film and the P-type electrode; and an n-pad formed to communicate with the N-type electrode via a through-hole that is formed in the n-GaN layer of the light-emitting structure, extending from the surface of the n-GaN layer to the N-type electrode.

Figure 2:
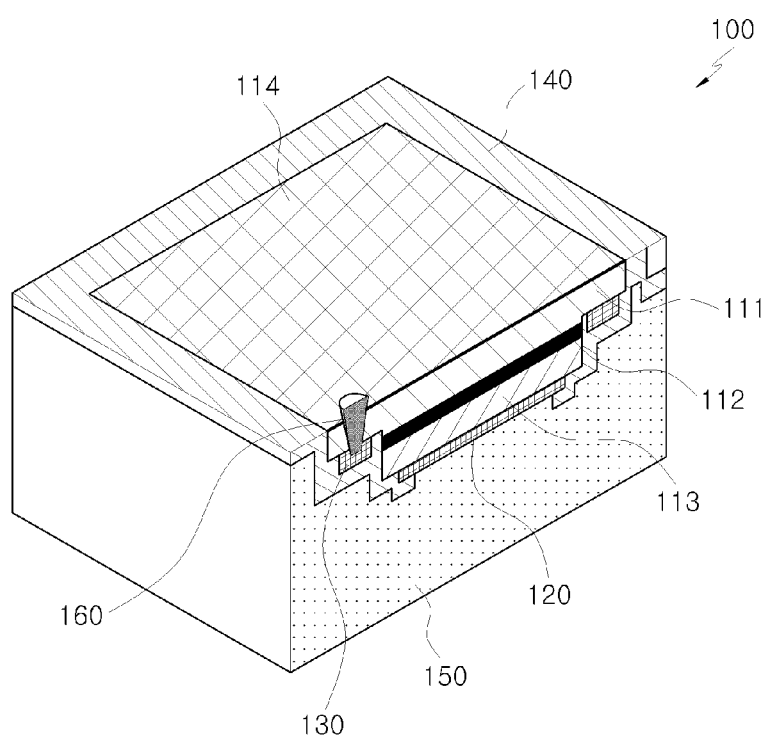
FIG. 2 is a perspective view showing a horizontal power LED device according to an embodiment of the present invention.

FIG. 2 is a cross sectional perspective view illustrating the outline of the horizontal power LED device 100 according to an embodiment of the present invention. Referring to FIG. 2, the horizontal power LED is configured such that an insulation film 140 is laterally formed on a metal substrate 150. Particularly, a light-emitting structure 110 is disposed at the upper center side of the horizontal power LED device 100, and covered at lateral sides thereof and a portion of the lower side thereof with the insulation film 140 while the remnant, uncovered portion of the lower side is provided with a p-type electrode. An n-GaN layer 111 of the light-emitting structure 110 is surrounded by the insulation film 140, accounting for the upper side of the horizontal power LED device 100.

The light-emitting structure 110, also referred to as an epitaxial layer, is a sequentially disposed semiconductor layer including: an N-type gallium nitride semiconductor layer (n-GaN layer) 111, an active layer 112 and a P-type gallium nitride semiconductor layer (p-GaN layer) 113.

In this regard, each of the n-GaN layer 111, the active layer 112 and the p-GaN layer 113 may be made of a gallium nitride-based semiconductor material represented by the empirical formula $Al_xIn_yGa_{(1-x-y)}N$ (here, $0 \leq x \leq 1$, $0 \leq x \leq 1$, $0 \leq x+y \leq 1$), and may be formed by a conventional nitride deposition process, such as metal organic chemical vapor deposition (MOCVD) or molecular beam epitaxy (MBE). Particularly, the active layer 112 may be formed to have a multi quantum well structure or a single quantum well structure.

As such, the light-emitting structure 110 is a laminated structure in which the n-GaN layer 111, the active layer 112 and the p-GaN layer 113 are sequentially disposed from top to bottom. Here, the p-GaN layer 113 has a P-type electrode 120 formed on a surface thereof that is not adjacent to the active layer 112 while the n-GaN layer 111 has an N-type electrode 130 formed on a back side thereof that is adjacent to the active layer 112. The N-type electrode 130 is constructed as buried in the light-emitting structure 110, particularly, under the n-GaN layer 111. In this organization, an n-pad 160 is formed to communicate with the N-type electrode 130 via a through-hole extending from the surface of the n-GaN layer 111 of the light-emitting structure 110, that is, the upper surface of the horizontal power LED device 100 to the buried N-type electrode.

The metal substrate 150 may be formed of one or more of copper (Cu), nickel (Ni), gold (Au) and molybdenum (Mo). Particularly, the metal substrate 150 may be a copper (Cu) layer, a nickel (Ni) layer, a copper (Cu)/gold (Au) layer, a nickel (Ni)/gold (Au) layer, a copper (Cu)/nickel (Ni)/gold (Au) layer, a nickel (Ni)/copper (Cu)/gold (Au) layer, or a nickel (Ni)/molybdenum (Mo)/nickel (Ni)/gold (Au) layer.

Further, the metal plate 150 is formed to have enough thickness to support a semiconductor structure, and serves to prevent the light-emitting structure from being damaged by providing a surface directly notched by a cutting device such as laser when a cutting process including a laser scribing process for separating the light-emitting structure into unit LED devices is performed.

Although not shown, convex-concave portions 114 may be further formed on the surface of the n-GaN layer 111 such that the escape angle of photons is optimized by light extraction efficiency through a surface roughening process.

That is, when the upper surface of the light-emitting structure 110 is even, most of light outgoing at an angle perpendicular to or similar to the upper surface thereof is reflected, thus not allowing the light to be extracted to the outside. However, when the upper surface of the light-emitting structure 110 is provided with convex-concave portions, the escape angle of light to the upper surface thereof can be decreased, that is, external light extraction efficiency can be increased, thereby increasing the light emitting efficiency of a horizontal LED chip.

Meanwhile, although not shown, a seed layer may be further provided among the insulation film 140, the P-type electrode 120 and the metal substrate 150. Whether or not the seed layer is provided may be changed according to the method of forming the metal substrate 150. In this case, when the metal substrate is formed by a plating process, it is preferred that the seed layer be provided. Selectively, when the P-type electrode of the horizontal power LED device of the present invention is a transparent electrode, the seed layer may be used as a reflective layer.

Consequently, according to the horizontal power LED device 100 of the present invention, electric current is introduced only by the n-pad 160, and the n-electrode 130 formed in the form of a grid or the like is buried, thus minimizing the reduction of a light-emitting area attributable to electrodes.

That is, the horizontal power LED device of the present invention is configured such that the N-type electrode is formed on the light-emitting surface in a grid pattern in order to easily conduct current spreading with the area of a conventional vertical LED chip becoming large, thus minimizing the reduction of the light-emitting area.

Further, according to the horizontal power LED device 100 of the present invention, the entire spreading is conducted by an embedded grid electrode, while current spreading is horizontally conducted, thus not causing a current crowding phenomenon. Further, according to the horizontal power LED device 100 of the present invention, this horizontal power LED device 100 has conventional vertical chip characteristics due to the formation of the metal substrate 150, and has flip chip characteristics because a sub-mount or a soldering process is not required.

MODE FOR INVENTION

Figure 3:
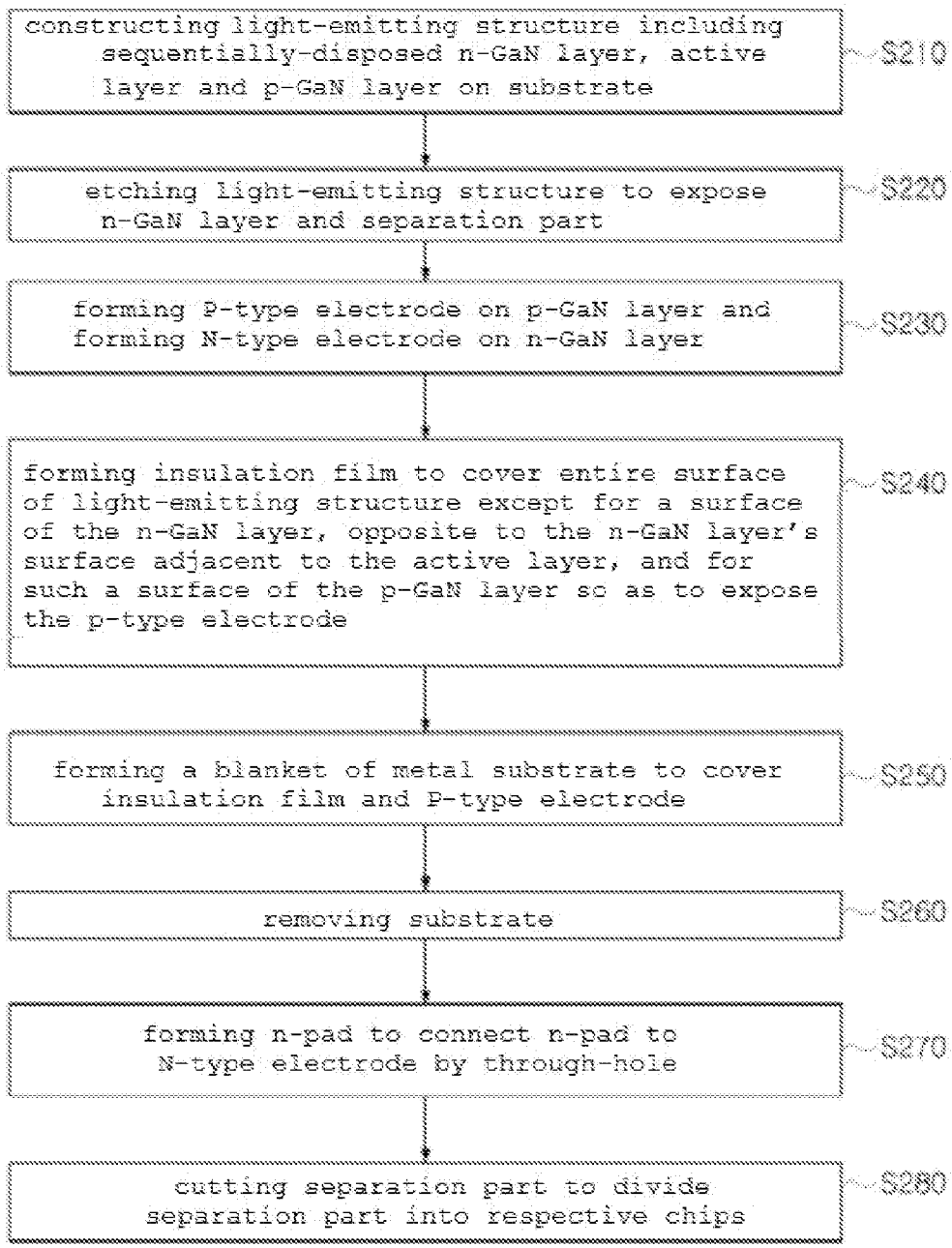
FIG. 3 is a flowchart showing a method of manufacturing a horizontal power LED device according to an embodiment of the present invention.

FIG. 3 is a flowchart showing a method of manufacturing a horizontal power LED device according to an embodiment of the present invention; FIGS. 4a to 4g are sectional views and plan views showing a process of manufacturing a horizontal power LED device according to an embodiment of the present invention; and FIGS. 4a to 4h are sectional views and plan views showing a process of manufacturing the horizontal power LED device of FIG. 2.

Hereinafter, a method of manufacturing a horizontal power LED device according to an embodiment of the present invention will be described in detail with reference to FIG. 3. First, the method of manufacturing a horizontal power LED device according to an embodiment of the present invention includes the steps of: constructing a light-emitting structure (S210); etching the light-emitting structure (S220); fabricating an electrode (S230); forming an insulation film (S240); forming a metal substrate (S250); removing a substrate (S260); and forming an n-pad (S270). The method may further include the step of cutting (S280), when a plurality of chips is formed.

First, the light-emitting structure constructing step (S210) is carried out. An N-type gallium nitride semiconductor layer (n-GaN layer), an active layer and a P-type gallium nitride semiconductor layer (p-GaN layer) are sequentially disposed to construct a laminated light-emitting structure.

Figure 4A:
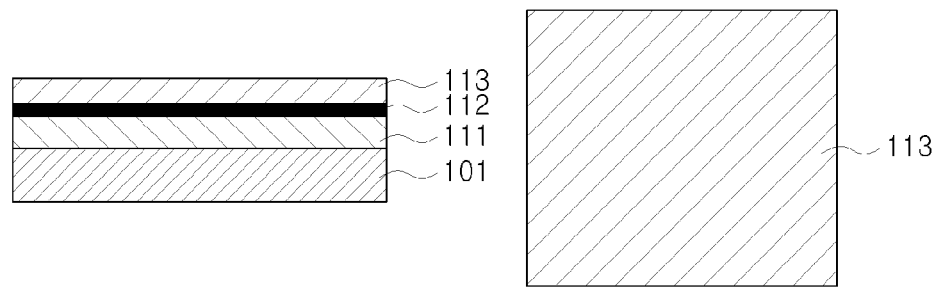
FIGS. 4a to 4g are sectional views and plan views showing a process of manufacturing a horizontal power LED device according to an embodiment of the present invention.

In this regard, as shown in FIG. 4a, a substrate 101 is provided. The substrate 101 is made of a transparent material including sapphire. Alternatives to sapphire may include oxide (ZnO), gallium nitride (GaN), silicon carbide (SiC) and aluminum nitride (AlN) for use as materials for the substrate 101. An n-GaN layer 111, an active layer 112 and a p-GaN layer 113 are sequentially disposed on the substrate 101.

If necessary, prior to the formation of the n-GaN layer 111, an undoped gallium nitride-based semiconductor layer (u-GaN layer, not shown) may be further formed on the substrate 101. Further, in order to improve the characteristics of the light-emitting structure, that is, an epitaxial layer and minimize the loss of the epitaxial layer when the substrate 101 is removed in the following process, prior to the formation of the u-GaN layer (not shown), a buffer layer (not shown) may be additionally formed on the substrate 101.

The next step is to etch the light-emitting structure (S220). In this etching step (S220), the light-emitting structure 110 is etched to expose the n-GaN layer 111 and the substrate 101 in such a way to form a separation part having a size corresponding to a predetermined chip size.

Figure 4B:
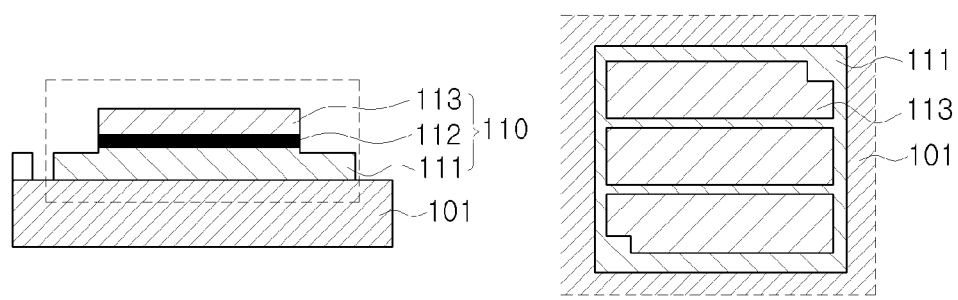

As shown in FIG. 4b, the p-GaN layer 113 and the active layer 112 are etched such that the n-GaN layer 111 is exposed, with the etched p-GaN layer positioned at the center of the resulting structure, after which the exposed the n-GaN layer 111 is etched such that the substrate 101 is exposed to form a separation part at the end of the n-GaN layer 111. In this regard, the shape of the exposed n-GaN layer 111 is determined according to the pattern of an N-type electrode to be formed. As shown in the plan view of FIG. 4b, the p-GaN layer 113 and the active layer 112 are etched such that the n-GaN layer 111 is exposed in the shape of a grid, and the n-GaN layer 111 is etched such that the substrate 101 is exposed to form a separation part surrounding the exposed n-GaN layer 111.

Although not shown, the light-emitting structure etching step (S220) may be conducted by etching the light-emitting structure 110 to expose the substrate 101, then further etching the light-emitting structure 110 to expose only a part of the n-GaN layer 111, thereby forming a separation part. That is, the light-emitting structure 110 is etched to a chip size to expose the substrate 101, after which a hole is formed in the active layer 112 without further etching the p-GaN layer 113 in the state where the lateral side of the laminated structure of the etched n-GaN layer 111, the active layer 112 and the p-GaN layer 113 is exposed, thus allowing the n-GaN layer 111 to be exposed. In this case, the n-GaN layer 111 has the same area as the p-GaN 113 when the LED device is finally completed.

Subsequently, the electrode fabricating step (S230) is conducted. In this step, a P-type electrode 120 is fabricated on the p-GaN layer 113, and an N-type electrode 130 is fabricated on the exposed region of the n-GaN layer 111.

Figure 4C:
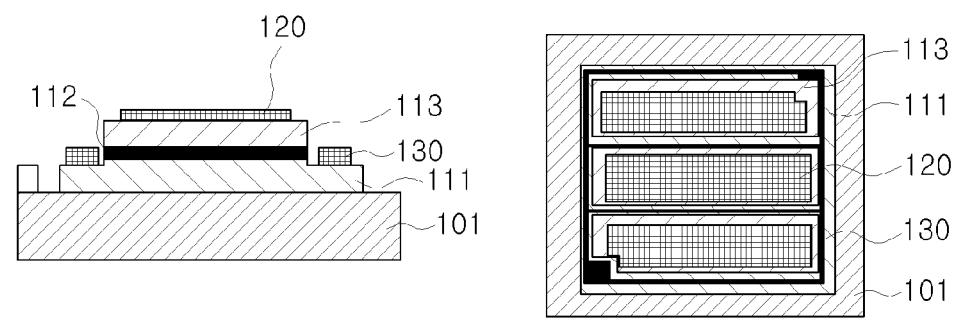

As shown in FIG. 4c, the P-type electrode 120 and the N-type electrode 130 may be formed simultaneously, or independently at different time points irrespective of the order of fabrication. Herein, the N-type electrode 130 may be formed in a grid pattern corresponding to the shape of the n-GaN layer 111 exposed in the the light-emitting structure etching step (S220).

Thereafter, an insulation film forming step (S240) is conducted. An insulation film 140 is deposited to cover the p-GaN layer 113 and the exposed n-GaN layer 111, followed by etching the insulation film to expose the P-type electrode 120 formed on the p-GaN layer 113.

Figure 4D:
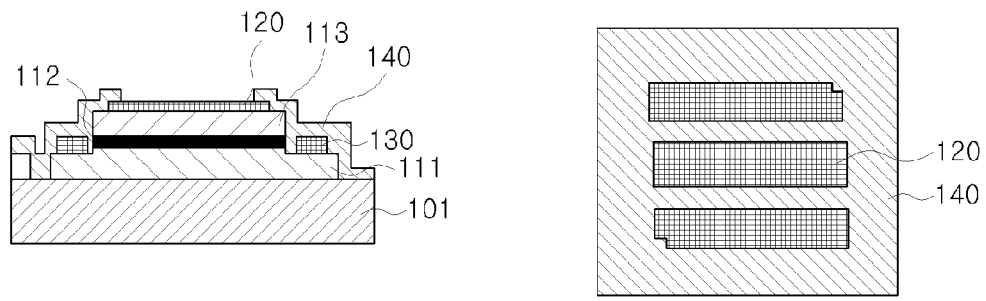

In the insulating film forming step (S240), as shown in FIG. 4d, even the separation part formed by the exposure of the substrate 101 is also covered by the insulation film 140, thus allowing only the P-type electrode 120 and the insulation film 140 to be seen observed, as viewed in the plan view.

Subsequently conducted is the metal substrate forming step (S250). In this step, a blanket of a metal substrate is provided to cover the insulation film 140 and the P-type electrode 120, entirely.

Figure 4E:
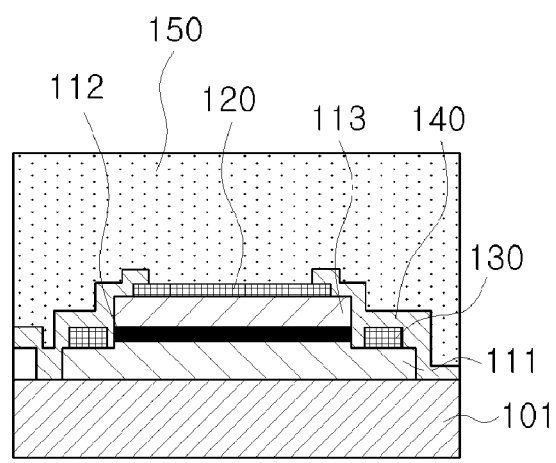

In metal substrate forming step (S250), as shown in FIG. 4e, the metal substrate 150 having predetermined thickness is formed to cover the light-emitting structure 110 is entirely covered with the metal substrate 150 thick enough to have an upper surface parallel to the substrate 101 positioned below. The metal substrate 150 may be formed by various methods. For a plating process, a seed layer, although not shown, is preferably formed to cover the insulation film 140 and the p-type electrode 120 in advance of performing the metal substrate forming step (S250). If formed, the seed layer may be used as a reflective layer when the P-type electrode is a transparent electrode.

Next, the substrate removing step (S260) is conducted by removing the substrate 101 from the light-emitting structure 110.

Figure 4F:
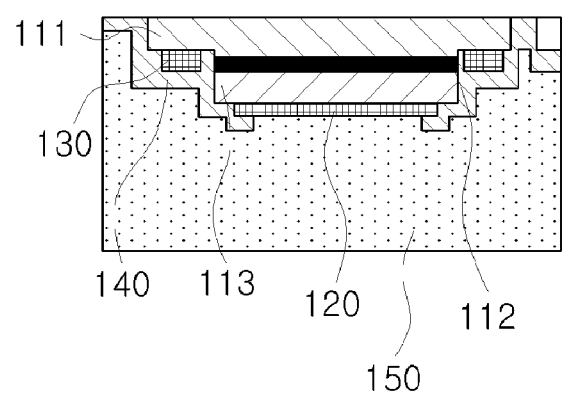

After the substrate removing step (S260) is conducted, as shown in FIG. 4f, the resulting structure is preferably overturned such that the light-emitting structure 110 is disposed on the metal substrate 150 in order to facilitate subsequent steps. The substrate 101 may be removed by a known method. Preferably, the substrate 101 may be removed by a laser lift off (LLO) method or a chemical lift off (CLO) method. Considering the productivity, the LLO method is more advantageous.

The next step is an n-pad forming step (S270). In this step, a through-hole is formed in the n-GaN layer 111 at a margin region, extending from the upper surface of the n-GaN layer 111 to the N-type electrode 130, and then an n-pad 160 is deposited such that it communicates with the N-type electrode 130 via the through-hole.

Figure 4G:
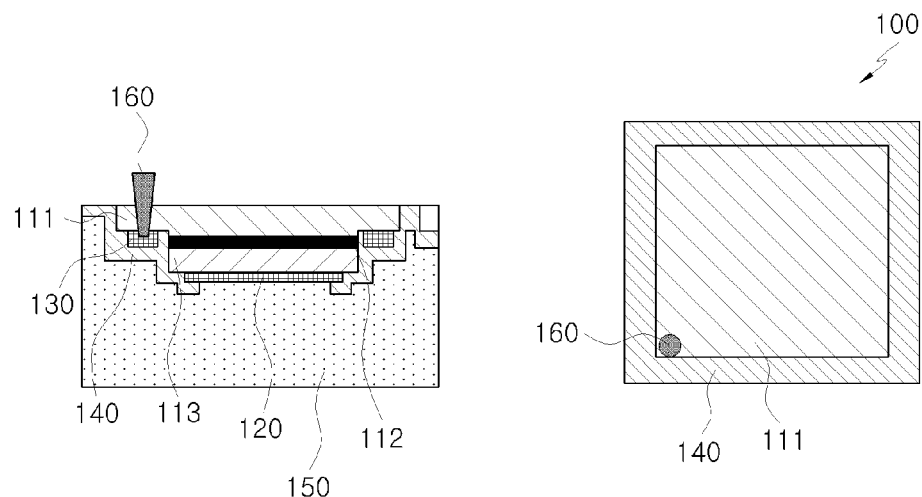

As shown in FIG. 4g, when the step of forming the n-pad (S270) is performed, it can be seen that the horizontal power LED device according to an embodiment of the present invention is completed. In other words, the presence of the n-pad 160 enables the application of electric current to the N-type electrode buried in the light-emitting structure.

Therefore, a conventional vertical LED device is disadvantageous in that the loss of an n-clad layer for current spreading is caused because a sapphire substrate is removed and the n-clad layer is etched in order to expose an n-GaN layer, but the horizontal power LED device manufactured by the method of the present invention is advantageous to current spreading because the thickness of the n-clad layer can be maintained. Further, since the surface of the n-GaN exposed after the removal of the substrate 101 has N-face polarity, the formation of an ohmic electrode in a conventional Ga-face polarity surface is different in mechanism, and thus the loss for forming n-ohmic electrode is required. However, since the N-type electrode is formed on the conventional Ga-face, low Vf can be applied.

Figure 4H:
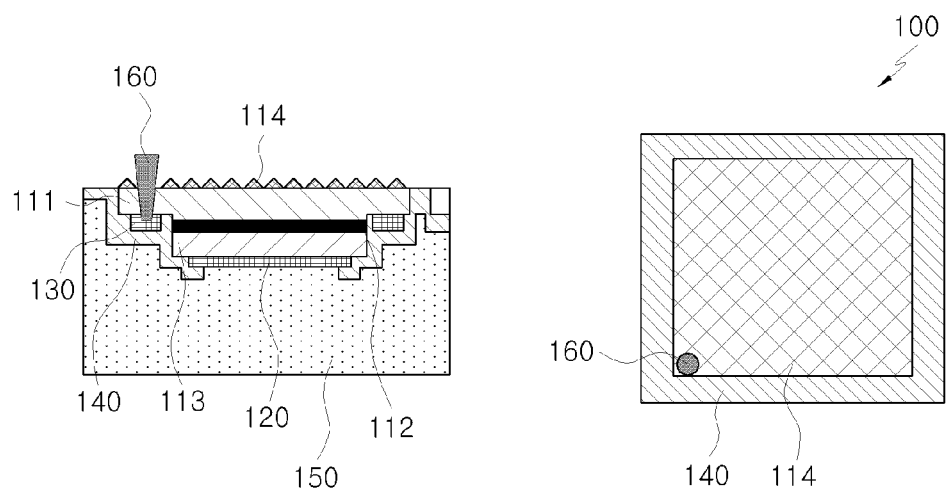

Optionally, although not shown in FIG. 3, as shown in FIG. 4h, a step of forming convex-concave portions on the surface of the n-GaN layer 111 of the light-emitting structure 110 may be further performed before or after the n-pad forming step (S270).

As shown in FIG. 4h, the convex-concave portions 114 for optimizing the escape angle of photons is formed on the upper surface of the light-emitting structure 110, that is, on the surface of the n-GaN layer 111. For example, the convex-concave portions 114 may be formed by wet etching. The convex-concave portions 114 may be formed in the shape of a triangle (shown), a polygon such as a lozenge, or in a random shape. The shape thereof is not limited to specific shapes.

Finally, as shown in FIG. 3, when the processes of FIGS. 4a to 4g or 4a to 4h are performed in order to form a plurality of chips, the separation part is cut such that each light-emitting structure is included, thus forming a unit LED device 100. The cutting of the separation part may be performed by laser scribing or wheel cutting.

Through such processes (FIGS. 4a to 4h), the horizontal power LED device shown in FIG. 2 can be manufactured.

As described above, the horizontal power LED device manufactured by the above-mentioned method is advantageous in that the reduction of a light emission area due to electrodes can be maximized, the thickness of the n-clad layer can be maintained, the N-type electrode can be formed on the conventional Ga-face, the metal substrate is provided, and convex-concave portions are formed on the upper surface of the light-emitting structure, so the reflectivity of light can be reduced, and thus the light extraction efficiency of light emitted from the active layer can be increased, thereby exhibiting high power and high efficiency.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a horizontal power LED device, the method comprising:
    constructing a light-emitting structure on a substrate, the light-emitting structure being a laminated structure in which an N-type gallium nitride semiconductor layer (n-GaN layer), an active layer and a P-type gallium nitride semiconductor layer (p-GaN layer) are sequentially disposed;
    etching the light-emitting structure to expose the n-GaN layer and the substrate so as to form a separation part having a size corresponding to a predetermined chip size;
    fabricating an electrode by forming a P-type electrode on the p-GaN layer and by forming an N-type electrode on an exposed region of n-GaN layer;
    forming an insulating film by depositing an insulation material to cover the p-GaN layer and the exposed n-GaN layer, and then by etching the deposited insulation material to expose a P-type electrode formed on the p-GaN layer;
    forming a metal substrate to cover the insulation film and the P-type electrode;
    removing the substrate from the light-emitting structure; and
    forming an n-pad by forming a through-hole in the n-GaN layer at a margin region, extending from the upper surface of the n-GaN layer to the N-type electrode, and by depositing the n-pad in such a manner that the n-pad communicates with the N-type electrode via the through-hole.

2. The method of claim 1, further comprising forming convex-concave portions on the surface of the n-GaN layer of the light-emitting structure, before or after the n-pad formation.

3. The method of claim 1, further comprising forming a seed layer to cover the insulation film and the P-type electrode, before the metal substrate formation.

4. The method of claim 1, wherein the light-emitting structure etching is carried out such that the p-GaN layer and the active layer are etched to expose the n-GaN layer, with the etched p-GaN layer positioned at a center of the resulting structure, after which the exposed the n-GaN layer is etched such that the substrate is exposed to form a separation part at the end of the n-GaN layer.

5. The method of claim 1, wherein the light-emitting structure etching is conducted by etching the light-emitting structure to expose the substrate forming a separation part, and then further etching the light-emitting structure to expose only a part of the n-GaN layer.

6. The method of claim 1, further comprising forming a chip by cutting the separation part.

7. The method of claim 1, wherein the metal substrate includes one or more of copper (Cu), nickel (Ni), gold (Au) and molybdenum (Mo).

8. The method of claim 2, further comprising forming a seed layer to cover the insulation film and the P-type electrode, before the metal substrate formation.

9. The method of claim 2, wherein the light-emitting structure etching is carried out such that the p-GaN layer and the active layer are etched to expose the n-GaN layer, with the etched p-GaN layer positioned at a center of the resulting structure, after which the exposed the n-GaN layer is etched such that the substrate is exposed to form a separation part at the end of the n-GaN layer.

10. The method of claim 2, wherein the light-emitting structure etching is conducted by etching the light-emitting structure to expose the substrate forming a separation part, and then further etching the light-emitting structure to expose only a part of the n-GaN layer.

11. The method of claim 2, further comprising forming a chip by cutting the separation part.

12. The method of claim 2, wherein the metal substrate includes one or more of copper (Cu), nickel (Ni), gold (Au) and molybdenum (Mo).

* * * * *